United States Patent
Monangi

(10) Patent No.: US 10,516,411 B1
(45) Date of Patent: Dec. 24, 2019

(54) COMMON MODE REJECTION IN RESERVOIR CAPACITOR ANALOG-TO-DIGITAL CONVERTER

(71) Applicant: Analog Devices Global Unlimited Company, Hamilton (BM)

(72) Inventor: Sandeep Monangi, Srikakulam (IN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/032,752

(22) Filed: Jul. 11, 2018

(51) Int. Cl.
| | |
|---|---|
| *H03M 1/12* | (2006.01) |
| *H03M 1/46* | (2006.01) |
| *H03M 1/06* | (2006.01) |
| *H03M 1/68* | (2006.01) |
| *H03M 1/00* | (2006.01) |
| *H03M 1/80* | (2006.01) |
| *H03M 1/10* | (2006.01) |
| *G11C 27/02* | (2006.01) |

(52) U.S. Cl.
CPC ......... *H03M 1/466* (2013.01); *H03M 1/0612* (2013.01); *H03M 1/1245* (2013.01); *H03M 1/462* (2013.01); *H03M 1/68* (2013.01); *G11C 27/02* (2013.01); *H03M 1/002* (2013.01); *H03M 1/06* (2013.01); *H03M 1/10* (2013.01); *H03M 1/802* (2013.01); *H03M 1/804* (2013.01)

(58) Field of Classification Search
CPC ........ H03M 1/802; H03M 1/804; H03M 1/12; H03M 1/10; H03M 1/06; G11C 27/02
USPC ................. 341/172, 122, 155, 141, 120, 118
See application file for complete search history.

(56) References Cited

U.S. PATENT DOCUMENTS

| | | |
|---|---|---|
| 4,940,981 A | 7/1990 | Naylor et al. |
| 4,975,700 A | 12/1990 | Tan et al. |
| 5,047,665 A | 9/1991 | Burt |
| 6,124,818 A | 9/2000 | Thomas et al. |
| 6,400,302 B1 | 6/2002 | Amazeen et al. |
| 6,448,911 B1 | 9/2002 | Somayajula |
| 6,473,021 B1 | 10/2002 | Somayajula et al. |
| 6,490,332 B1 | 12/2002 | Somayajula |
| 6,538,594 B1 | 3/2003 | Somayajula |
| 6,559,789 B1 | 5/2003 | Somayajula |
| 6,603,415 B1 | 8/2003 | Somayajula |
| 6,977,607 B2 | 12/2005 | Leung et al. |
| 7,358,809 B2 | 4/2008 | Elder |
| 7,432,844 B2 | 10/2008 | Mueck et al. |
| 7,675,452 B2 | 3/2010 | Madhavan et al. |
| 7,961,131 B2 | 6/2011 | Craninckx |
| 8,390,502 B2 | 3/2013 | Kapusta |
| 8,537,045 B2 | 9/2013 | Kapusta |
| 8,552,897 B1 | 10/2013 | Hurrell |
| 8,933,830 B1 | 1/2015 | Jeon |
| 8,981,972 B2 | 3/2015 | Shen et al. |

(Continued)

OTHER PUBLICATIONS

"U.S. Appl. No. 15/983,658, Notice of Allowance dated Feb. 25, 2019", 8 pgs.

(Continued)

*Primary Examiner* — Joseph J Lauture
(74) *Attorney, Agent, or Firm* — Schwegman Lundberg & Woessner, P.A.

(57) ABSTRACT

A differential digital-to-analog (DAC) circuit that can include a reservoir capacitor and various switches to couple the bottom plates of the input capacitors, e.g., bit-trial capacitors, to reference voltages, e.g., REF+ or REF−. In this manner, the reservoir capacitor can be used to provide any differential charge to the input capacitors, e.g., bit-trial capacitors, and the reference voltages, e.g., REF+ and REF−, can be used to provide any common mode charge to the input capacitors.

20 Claims, 9 Drawing Sheets

(56) References Cited

U.S. PATENT DOCUMENTS

| | | |
|---|---|---|
| 9,503,055 B2 | 11/2016 | Meehan et al. |
| 9,608,655 B1 | 3/2017 | Li et al. |
| 9,806,734 B1 | 10/2017 | Madan et al. |
| 10,291,249 B2 | 5/2019 | Coln |
| 10,348,319 B1 | 7/2019 | Monangi et al. |
| 2004/0257256 A1 | 12/2004 | Leung et al. |
| 2006/0125563 A1 | 6/2006 | Elder |
| 2008/0129573 A1 | 6/2008 | Mueck et al. |
| 2009/0273501 A1 | 11/2009 | Madhavan et al. |
| 2010/0283643 A1 | 11/2010 | Byrne et al. |
| 2011/0032134 A1 | 2/2011 | Cho et al. |
| 2011/0260899 A1 | 10/2011 | Snedeker |
| 2012/0154193 A1 | 6/2012 | Chang et al. |
| 2012/0154194 A1 | 6/2012 | Chang et al. |
| 2012/0274488 A1 | 11/2012 | Kapusta |
| 2012/0280841 A1 | 11/2012 | Wang et al. |
| 2013/0249727 A1 | 9/2013 | Hurrell |
| 2014/0167995 A1 | 6/2014 | Tiew et al. |
| 2014/0197971 A1 | 7/2014 | Kuppambatti |
| 2014/0266839 A1 | 9/2014 | Cullinane et al. |
| 2014/0266847 A1 | 9/2014 | Shen et al. |
| 2014/0296687 A1 | 10/2014 | Irazoqui et al. |
| 2015/0002321 A1 | 1/2015 | Zhou et al. |
| 2015/0091746 A1 | 4/2015 | Wang |
| 2015/0263756 A1 | 9/2015 | Chiu et al. |
| 2015/0318841 A1 | 11/2015 | Meehan et al. |
| 2016/0149586 A1 | 5/2016 | Roh et al. |
| 2016/0182078 A1* | 6/2016 | Shen ............... H03M 1/08 341/122 |
| 2016/0308550 A1 | 10/2016 | Tang |
| 2018/0019761 A1 | 1/2018 | Coln |
| 2018/0131384 A1 | 5/2018 | Kalathil et al. |

OTHER PUBLICATIONS

U.S. Appl. No. 15/213,078, filed Jul. 18, 2016, Common Mode Rejection in a Reservoir Capacitor SAR Converter.

U.S. Appl. No. 15/983,658, filed May 18, 2018, Reservoir Capacitor Based Analog-To-Digital Converter.

"U.S. Appl. No. 15/213,078, Notice of Allowance dated Jan. 28, 2019", 9 pgs.

"U.S. Appl. No. 15/213,078, Non Final Office Action dated Jul. 27, 2018", 22 pgs.

"U.S. Appl. No. 15/213,078, Examiner Interview Summary dated Oct. 25, 2018", 3 pgs.

"U.S. Appl. No. 15/213,078, Response filed Oct. 18, 2018 to Non Final Office Action dated Jul. 27, 2018", 15 pgs.

"U.S. Appl. No. 15/213,078, Final Office Action dated May 19, 2017", 24 pgs.

"U.S. Appl. No. 15/213,078, Non Final Office Action dated Sep. 5, 2017", 23 pgs.

"U.S. Appl. No. 15/213,078, Non Final Office Action dated Dec. 29, 2016", 18 pgs.

"U.S. Appl. No. 15/213,078, Notice of Allowance dated Mar. 8, 2018", 10 pgs.

"U.S. Appl. No. 15/213,078, Preliminary Amendment dated Jun. 8, 2018", 11 pgs.

"U.S. Appl. No. 15/213,078, Response filed Jul. 19, 2017 to Final Office Action dated May 19, 2017", 14 pgs.

"U.S. Appl. No. 15/213,078, Response filed Dec. 18, 2017 to Non Final Office Action dated Sep. 5, 2017", 14 pgs.

"U.S. Appl. No. 15/213,078, Respnse filed Mar. 29, 2017 to Non Final Office Action dated Dec. 29, 2017", 12 pgs.

"U.S. Appl. No. 15/711,176, Notice of Allowance dated Mar. 20, 2018", 10 pgs.

"U.S. Appl. No. 15/711,176, Preliminary Amendment filed Apr. 25, 2018", 12 pgs.

"U.S. Appl. No. 15/711,176, Preliminary Amendment filed Oct. 17, 2017", 10 pgs.

"U.S. Appl. No. 15/983,658, 312 Amendment filed Apr. 18, 2019", 4 pgs.

"U.S. Appl. No. 15/983,658, PTO Response to Rule 312 Communication dated Apr. 30, 2019", 2 pgs.

* cited by examiner

COMMON MODE REJECTION IN RESERVOIR CAPACITOR ANALOG-TO-DIGITAL CONVERTER

FIELD OF THE DISCLOSURE

This document pertains generally, but not by way of limitation, to integrated circuits, and more particularly, to analog-to-digital converter circuits and systems.

BACKGROUND

Successive approximation routine (SAR) analog-to-digital converters (ADCs) convert an analog input to a digital value. Typically, the analog input is held while the SAR ADC circuit converges to a solution after a number of bit trials. Some SAR ADC circuits convert a differential analog input to a digital value. A differential SAR ADC may require that the common mode of the input signal to be at a fixed value, e.g., Vref/2. This can be accomplished by additional circuitry to translate the input common mode to the common mode required by the SAR ADC. However, this additional circuitry can result in additional space needed for an SAR ADC circuit, additional power consumption, and can introduce additional sources of noise in the signal chain.

SUMMARY OF THE DISCLOSURE

This disclosure describes, among other things, a differential digital-to-analog (DAC) circuit that can include a reservoir capacitor and various switches to couple the bottom plates of the input capacitors, e.g., bit-trial capacitors, to reference voltages, e.g., REF+ or REF−. In this manner, the reservoir capacitor can be used to provide any differential charge to the input capacitors, e.g., bit-trial capacitors, and the reference voltages, e.g., REF+ and REF−, can be used to provide any common mode charge to the input capacitors.

In some aspects, this disclosure is directed to a differential digital-to-analog (DAC) circuit comprising a capacitor array including a number of DAC units, each DAC unit including: a pair of input capacitors configured to couple to a comparator; a dedicated reference capacitor associated with the pair of input capacitors; and a control circuit configured to: control operation of a first set of switches to transfer a differential residue charge from the reservoir capacitor to the pair of input capacitors when setting the pair of input capacitors in a differential configuration based on a decision of the comparator; and control operation of a second set of switches to transfer a common-mode residue charge from a reference voltage to set the pair of input capacitors when setting the pair of input capacitors in a common-mode configuration based on a decision of the comparator.

In some aspects, this disclosure is directed to a method of operating a differential analog-to-digital converter (ADC) circuit to convert an analog input to a digital output. The method comprises coupling the analog input onto a capacitor array of a first ADC circuit, the capacitor array including a number of DAC units, each DAC unit including: a pair of input capacitors; and a dedicated reference capacitor associated with the pair of input capacitors. The method further comprises transferring a differential residue charge from the reservoir capacitor to the pair of input capacitors when setting the pair of input capacitors in a differential configuration based on a decision of a comparator; and transferring a common-mode residue charge from a reference voltage to set the pair of bit-trial capacitors when setting the pair of bit-trial capacitors in a common-mode configuration based on a decision of the comparator.

In some aspects, this disclosure is directed to a differential digital-to-analog (DAC) circuit comprising means for coupling the analog input onto a capacitor array of a first ADC circuit, the capacitor array including a number of DAC units, each DAC unit including: a pair of input capacitors; and a dedicated reference capacitor associated with the pair of input capacitors; and means for transferring a differential residue charge from the reservoir capacitor to the pair of input capacitors when setting the pair of input capacitors in a differential configuration based on a decision of a comparator; and means for transferring a common-mode residue charge from a reference voltage to set the pair of bit-trial capacitors when setting the pair of bit-trial capacitors in a common-mode configuration based on a decision of the comparator.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Successive approximation routine (SAR) analog-to-digital converters (ADCs) convert an analog input to a digital value. Typically, the analog input is held while the SAR ADC circuit converges to a solution after a number of bit trials. Some SAR ADC circuits convert a differential analog input to a digital value. A differential SAR ADC may require that the common mode of the input signal to be at a fixed value, e.g., Vref/2.

If the input common mode voltage varies from the fixed value, e.g., Vref/2, the common mode voltage of the differential digital-to-analog (DAC) top plates can vary during the bit trials and the comparator in the ADC will have to manage this varying common mode voltage. Moreover, if the final common mode voltage during a conversion differs from conversion to conversion, nonlinear errors can be introduced. Therefore, it is desirable for a SAR ADC structure that accommodates variation of the input common mode voltage.

This disclosure describes, among other things, a differential digital-to-analog (DAC) circuit that can include a reservoir capacitor and various switches to couple the bottom plates of the input capacitors, e.g., bit-trial capacitors, to reference voltages, e.g., REF+ or REF−. In this manner, the reservoir capacitor can be used to provide any differential charge to the input capacitors, e.g., bit-trial capacitors, and the reference voltages, e.g., REF+ and REF−, can be used to provide any common mode charge to the input capacitors.

Figure 1:
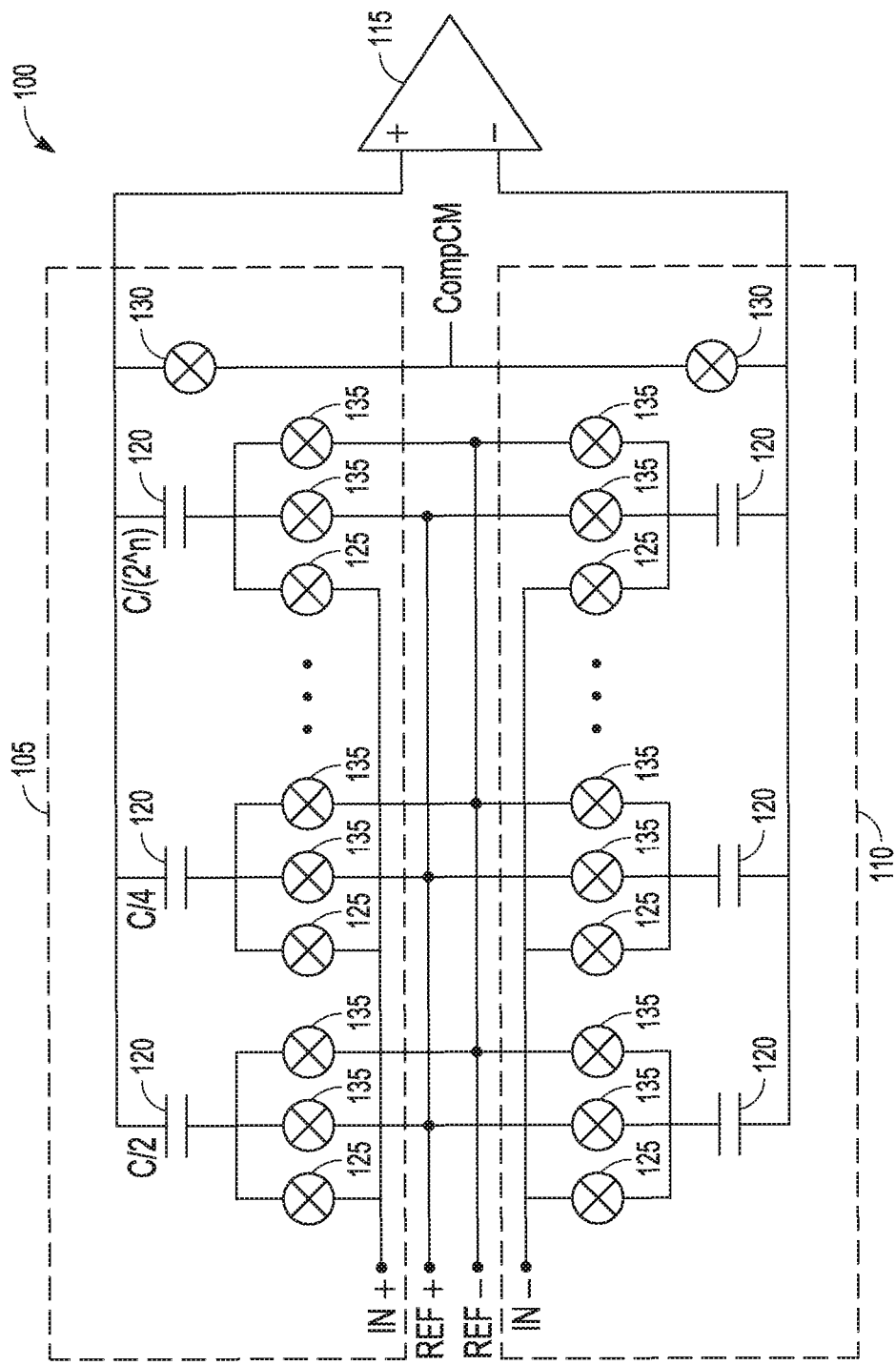
FIG. 1 is a functional block diagram of an example of a differential SAR ADC.

FIG. 1 is a functional block diagram of an example of a differential SAR ADC. The SAR ADC 100 includes a positive digital-to-analog converter (DAC) circuit 105, a negative DAC circuit 110, and a comparator circuit 115. Each DAC circuit (or "DAC" in this disclosure) can include weighted bit-trial capacitors 120. In the example, the capacitors are weighted as C/2, C/4 ... C/($2^N$), where N is the number of bits in the DACs and C is the total capacitance of the bit-trial capacitors added together. A differential analog input voltage (IN+, IN−) can be sampled onto the bit-trial capacitors with respect to the common mode of the comparator (CompCM) by closing switches 125 and 130. The input voltage can be held on the capacitors by opening switches 130, then opening switches 125. The top plates of the capacitors can be at the CompCM voltage.

The positive DAC 105 and the negative DAC 110 can also be connected to positive and negative reference voltage (REF+, REF−). As part of the successive approximation routine, bit trials for each of the bit-trial capacitors can be performed iteratively. In a bit trial, the output of the positive DAC 105 and the output of the negative DAC 110 can be applied to the inputs of the comparator circuit 115. Based on the output of the comparator circuit, a bit capacitor can be connected to either REF+ or REF− using switches 135. If the bit capacitor is connected to REF+ the bit of the digital value corresponding to the bit-trial capacitors is assigned a logic value '1', and if the bit capacitor is connected to REF+ the bit of the digital value corresponding to the bit-trial capacitors is assigned a logic value '0'. Conversion can then proceed to the next bit capacitor until all bits of the digital value are determined.

Figure 2:
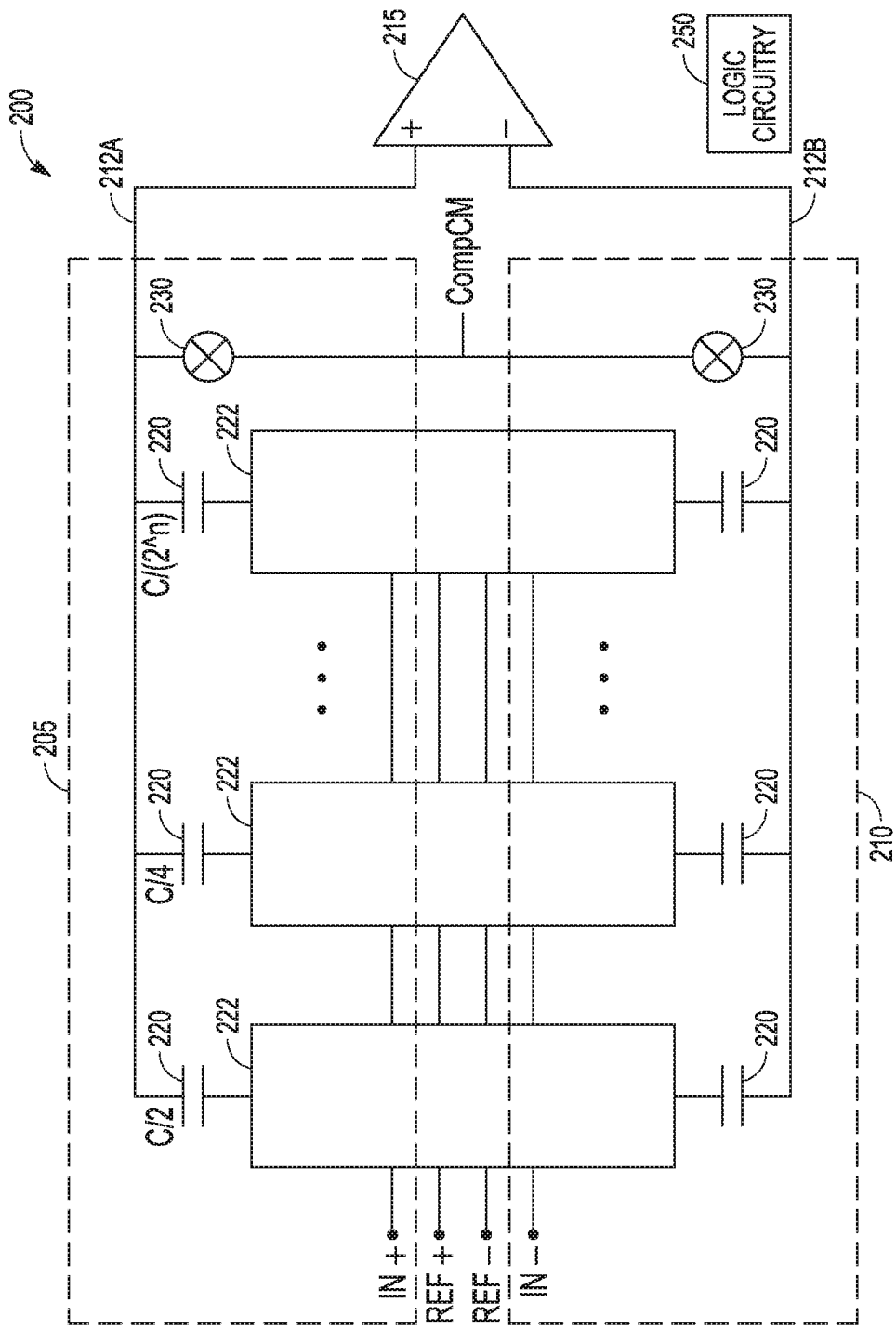
FIG. 2 is a functional block diagram of portions of an example of a reservoir-capacitor SAR ADC.

FIG. 2 is a functional block diagram of portions of an example of a reservoir-capacitor based SAR ADC 200. Similar to the SAR ADC of FIG. 1, the reservoir-capacitor based SAR ADC 200 includes two DAC circuits, a positive DAC circuit 205 and a negative circuit DAC circuit 210, and a comparator circuit 215. Each DAC circuit 205, 210 can form a capacitor array and can include weighted bit-trial capacitors 220 shown attached to circuit blocks 222 to simplify the figure. Some examples of the DACs include 8, 12, or 16-bit DACs. There can be a circuit block for each bit weight (C/2, C/4 ... C/($2^N$)) and a circuit block can include an arrangement of electronic switches and a reservoir capacitor. Each circuit block 222 can be a unit element or "DAC unit" of a respective DAC capacitor array.

The reservoir-capacitor SAR ADC 200 can include logic circuitry 250 (also referred to as a "control circuit"). In certain examples, the logic circuitry 250 can be included in an SAR ADC controller. In certain examples, the logic circuitry 250 can include a sequencer to advance the SAR ADC 200 through multiple circuit states to perform the SAR.

Figure 3:
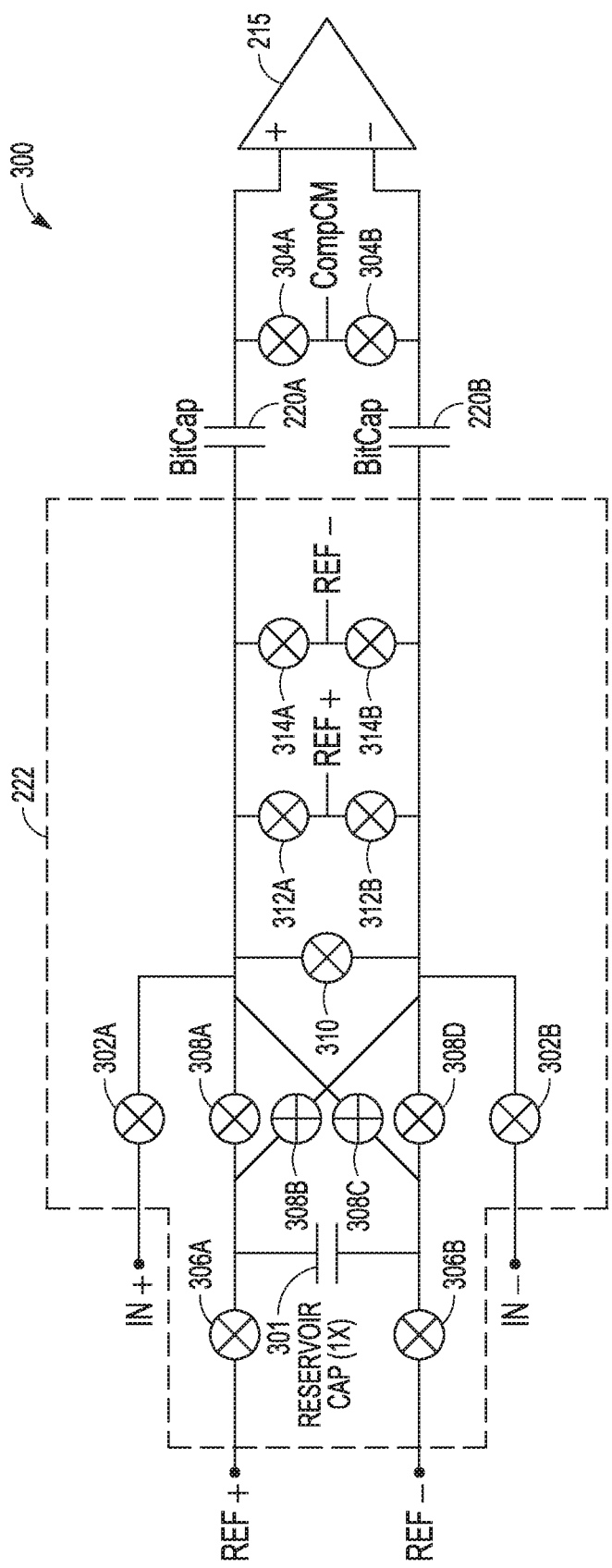
FIG. 3 is circuit diagram showing an example of a portion of a SAR ADC circuit including the circuit block of FIG. 2, in accordance with this disclosure.

FIG. 3 is circuit diagram showing an example of a portion of a SAR ADC circuit 300 including the circuit block 222 of FIG. 2, in accordance with this disclosure. The circuit block 222 can be a unit element or "DAC unit" of a capacitor array of a DAC circuit such that a DAC circuit, e.g., DAC circuit 205 of FIG. 2, can include a number of circuit blocks 222. For purposes of clarity, only one DAC unit is depicted in FIG. 3. Each circuit block 222 can be coupled to the differential analog input voltage (IN+, IN−), differential reference voltage (REF+, REF−), and comparator circuit 215.

The circuit block 222 can include a reservoir capacitor 301. In some example configurations, the reservoir capacitor 301 can be a dedicated reference capacitor associated with the pair of input capacitors 220A, 220B of a DAC unit element 222. The value of capacitance of a reservoir capacitor can be larger than the capacitance value of its corresponding bit capacitor. For example, the value of capacitance of a reservoir capacitor can be five to twenty times the capacitance of the bit-trial capacitors.

The differential analog input voltage (IN+, IN−) can sampled and stored onto input capacitors 220A, 220B, e.g., bit-trial capacitors, with respect to the comparator common mode (CompCM) using switches 302A, 302B (collectively "switches 302") and 304A, 304B (collectively "switches 304"). The reference voltage can be sampled on the reservoir capacitor 301 when the input voltage is sampled on the bit-trial capacitors 220 using switches 306A, 306B (collectively "switches 306"). Switches 308A-308D (collectively "switches 308") can isolate the reservoir capacitor 301 from the input capacitors 220A, 220B, e.g., bit-trial capacitors, during the sampling.

Logic circuitry, e.g., logic circuitry 250 of FIG. 2, can open switches 302, 304 and 306, and close switch 310 for a bit trial. Depending on the result of the bit trial at the comparator output, the voltage of the reservoir capacitor 301 can be added or subtracted from the voltage of the input capacitors 220A, 220B, e.g., bit-trial capacitors. The bit of the digital value corresponding to the trial can be set to a logical '1' or '0' depending on the comparator result and therefore whether the voltage of the reservoir capacitor 301 is added or subtracted from the bit-trial capacitors using switches 308.

Logic circuitry, e.g., logic circuitry 250 of FIG. 2, can progress the conversion of the differential analog input signal through all of the bit-trial capacitors until all bits of the digital value are determined. In certain examples, the logic circuitry can include a SAR controller (e.g., a processor) that progresses the SAR ADC through a conversion according to outcomes determined at the comparator circuit 215. In certain examples, the logic circuitry can include a logic sequencer that progresses the conversion through a series of logic states that correspond to steps of the bit trials. Using reservoir capacitors can speed up the bit trials from the embodiment of FIG. 1 because resampling does not need to take place during every bit trial.

The differential SAR ADCs of FIG. 1 and FIG. 2 can require that the common mode of the input signal be at Vref/2, for example. If the common mode of input signal is maintained at a fixed value, e.g., Vref/2, the common mode of the DAC top plates during the bit trials can be a fixed value $V_{CM\_COMP}$. At the end of the conversion, the bits of the negative DAC are complementary to the bits of the positive DAC, e.g., if a bit of the positive DAC is a "1", a bit of the negative DAC can be a "0".

If the input common mode varies from the fixed value, e.g., Vref/2, the common mode of the DAC top plates can vary during the bit trials and the comparator in the ADC will have to manage this varying common mode voltage. Moreover, if the final common mode voltage during a conversion differs from conversion to conversion, nonlinear errors can be introduced. As explained above, additional circuit components may be needed to provide an input to the ADC with a fixed common mode voltage. Therefore, it is desirable for a SAR ADC structure that accommodates variation of the input common mode voltage.

Using the techniques of this disclosure, additional switches can be included in the circuit block 222 to couple the bottom plates of the input capacitors, e.g., bit-trial capacitors 220, to reference voltages REF+ or REF−. As seen in FIG. 3, switches 312A, 312B (collectively "switches 312") can couple the bottom plates of the input capacitors, e.g., bit-trial capacitors 220A, 220B, to REF+ and switches 314A, 314B (collectively "switches 314") can couple the bottom plates of the input capacitors, e.g., bit-trial capacitors 220A, 220B, to REF−. In this manner, the reservoir capacitor 301 can be used to provide any differential charge to the capacitors 220A, 220B, and the reference voltages REF+ and REF− can be used to provide any common mode charge to the bit-trial capacitors 220A, 220B.

In this disclosure, the terms "top plate" and "bottom plate" are used for convenience to describe the capacitors and are not meant to imply that there is any required spatial orientation for the capacitors. Further, the switches referred to in this disclosure can include transistors and, in particular, complementary metal-oxide-semiconductor (CMOS) transistors due to their high performance and yield.

For an N-bit SAR ADC circuit, without an auxiliary ADC circuit, e.g., flash ADC or SAR ADC circuit, there can be 'N' circuit blocks 222 of FIG. 3, e.g., unit elements or "units" of a capacitor array of a DAC circuit, connected in parallel and coupled to the comparator 215. In some example configurations, all of the bit-trial capacitors 220 can be associated with a respective circuit block 222 similar to the example shown in FIG. 3. In other example configurations, only some of the bit-trial capacitors 220, e.g., at least some of the most significant bits (MSBs), can be associated with a respective circuit block 222 similar to the example shown in FIG. 3. For example, in some implementations, the least significant bit (LSB) bit-trial capacitors do not need to couple to reference voltages REF+ or REF− because they only resolve the differential signal information and, as such, switches 312 and 314 are not needed for the circuit blocks 222 associated with the LSBs. As such, in some examples, the circuit 300 associated with the LSBs can exclude switches 312 and 314.

Figure 4:
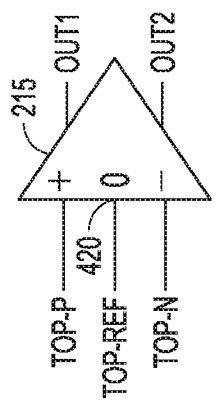
FIG. 4 is an example of a comparator circuit that can implement various techniques of this disclosure.

FIG. 4 is an example of a comparator circuit that can implement various techniques of this disclosure. The comparator circuit 215 of FIG. 4 is an example of the comparator circuit 215 of FIG. 3.

The comparator circuit 215 can include a non-inverting input (+) and an inverting input (−) coupled to the top plate nodes "TOP-P" and "TOP-N" that are coupled to the top plates of the bit-trial capacitors, e.g., top plates 212A and 212B of FIG. 2. The comparator 215 can include an additional input 420 that can be the intended DAC common mode output reference voltage for the comparator's differential inputs. The input 420 can be connected to a bias voltage (which could be any suitable voltage, including ground), although it could also be connected to other sources, for example a variable voltage that asymptotes to the bias voltage. The comparator circuit 415 can include an additional output OUT2, such that the outputs OUT1 and OUT2 are responsive to both the differential and common mode components of its inputs.

The logic circuitry, e.g., the logic circuitry 250 of FIG. 2, can accommodate the additional comparator outputs and produce independent bus outputs to control the positive DAC and negative DAC circuits.

The comparator circuit 215 of FIG. 4 is shown and described in commonly assigned U.S. Pat. No. 7,432,844 to Mueck et al., titled "Differential Input Successive Approximation Analog to Digital Converter with Common Mode Rejection," the entire contents of which being incorporated herein by reference, including FIGS. 7A-7E and the associated description of those figures.

The circuit 300 of FIG. 3 can form part of a main SAR ADC circuit. In some example configurations, both a main SAR ADC and an auxiliary ADC, e.g., a flash or SAR ADC, can be used in conjunction with the techniques described above with respect to FIG. 3. The auxiliary ADC can have a resolution less than the main ADC circuit.

Figure 5:
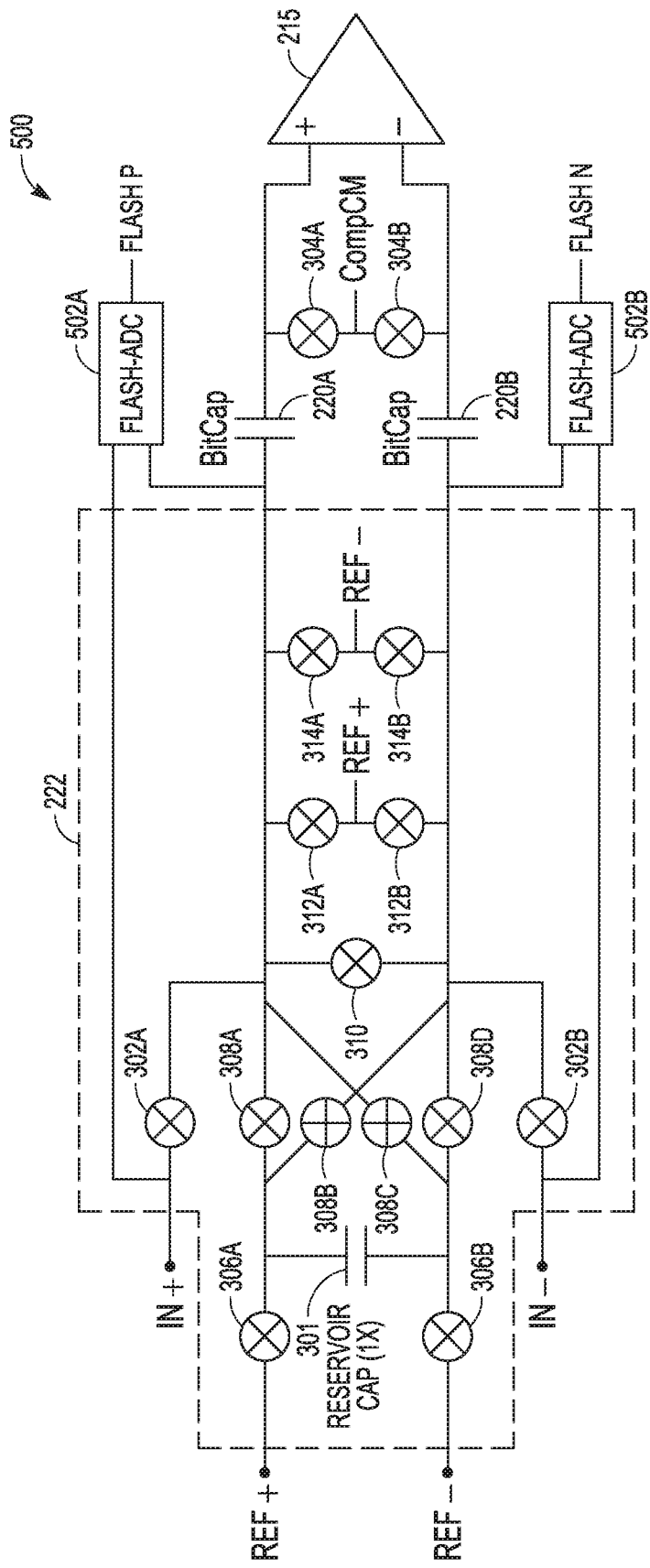
FIG. 5 is circuit diagram showing an example of a circuit that can include the main ADC circuit of FIG. 3 in combination with an auxiliary ADC circuit.

FIG. 5 is circuit diagram showing an example of a circuit 500 that can include the main ADC circuit of FIG. 3 in combination with an auxiliary ADC circuit. The circuit block 222 can be a unit element or "DAC unit" of a capacitor array of a DAC circuit such that a DAC circuit, e.g., DAC circuit 205 of FIG. 2, can include a number of circuit blocks 222. For purposes of clarity, only one DAC unit is depicted in FIG. 3. The circuit 500 can include a first auxiliary ADC circuit 502A to convert a voltage referenced from the input of the positive DAC circuit to the comparator common mode, and a second auxiliary ADC circuit 502B to convert a voltage referenced from the input of the negative DAC circuit to the comparator common mode.

The auxiliary ADC circuits 502A, 502B, e.g., a flash/SAR ADC circuits, can provide low resolution using a smaller sampling capacitor and a low power, relatively noisy comparator, and a main ADC, e.g., main ADC circuit 200 of FIG. 2, can provide for high resolution. An auxiliary ADC circuit can help convert higher input voltage ranges using a low voltage supply and can allow the main ADC to power down its comparator during the acquisition phase. An auxiliary ADC can convert the input voltage to, for example, 2-bit accuracy using a binary search algorithm. An auxiliary ADC can perform this conversion before the main ADC takes any action. Then, the auxiliary ADC circuit can transfer the results of the low-resolution conversion to the main ADC circuit, including to bit-trial capacitors 220, which can then resolve the remaining bits.

In some examples, auxiliary ADC circuits can be used in the comparison of the output of the positive DAC, the output of the negative DAC, and the common mode voltage of the comparator circuit. In the non-limiting example of FIG. 5, the auxiliary ADC circuit is a flash ADC circuit (also referred to as "a direct-conversion ADC").

Figure 9:
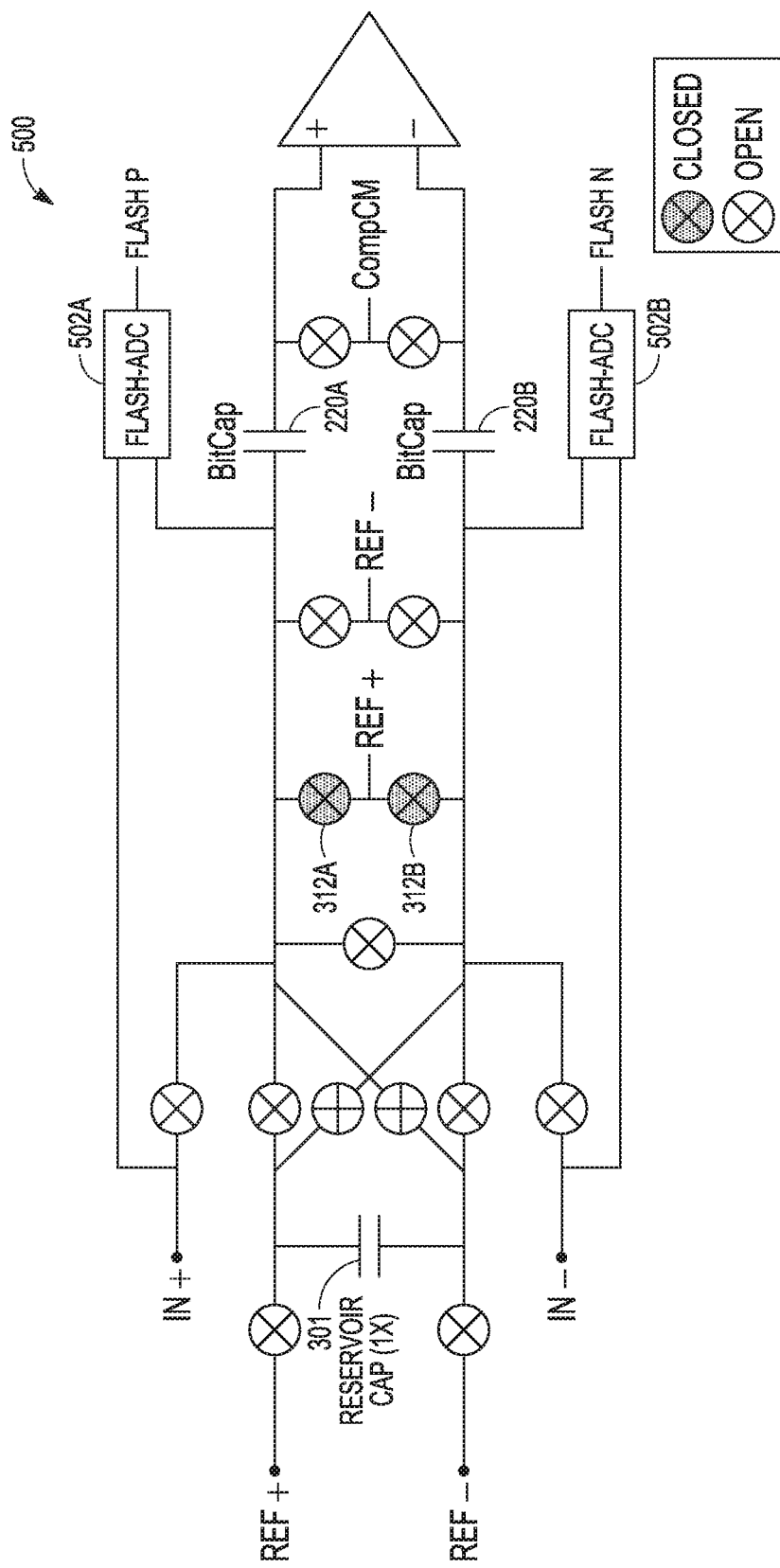
FIG. 9 is a schematic diagram of the circuit block of FIG. 5 in a positive common mode residue charge phase.

In contrast to a SAR ADC circuit, the result of the flash ADC circuit can be available after one conversion cycle. In the example of FIG. 9, the flash ADC circuit 502A can convert a voltage referenced from the input of the positive DAC circuit to the comparator common mode and flash ADC circuit 502B can convert a voltage referenced from the input of the negative DAC circuit to the comparator common mode. Before a conversion phase using the first ADC circuit, the logic circuit 250 can control couple the analog input signal onto the flash ADC circuits 502A, 502B, perform at least one bit-trial using the flash ADC circuits 502A, 502B, and load an output of the flash ADC circuits 502A, 502B onto at least one of the bit-trial capacitors of the first ADC circuit.

There are four possible outcomes or "states" (states "10", "01", "11", and "00") to the conversion of the input are shown in Table 1 below:

TABLE 1

| Case No. | FlashP | FlashN |
|---|---|---|
| 1 | 1 | 0 |
| 2 | 0 | 1 |
| 3 | 1 | 1 |
| 4 | 0 | 0 |

The states can be determined by the comparators of auxiliary ADC circuits, e.g., flash ADC circuits 502A, 502B of FIG. 5. In configurations that do not include auxiliary ADC circuits, such as shown in FIG. 3, the states can be determined by a comparator such as comparator 215 in FIG. 4.

In Case Nos. 1 and 2, the auxiliary ADC circuits for the bit position have different outcomes. For example, in Case No. 1, FlashP is 1 and FlashN is 0. For Case Nos. 1 and 2, there is no input common mode issue because the input voltage is intermediate the output voltage of the positive DAC circuit and the negative DAC circuit. For Case No. 1 capacitors 220A and 220B can resolve a positive differential residue. For Case No. 2, capacitors 220A and 220B can resolve a negative differential residue.

For case No. 3, both the input at the positive side and the input at the negative side are greater than the comparator common mode. Thus, the input voltage has a common mode different from the comparator common mode and the bit-trial capacitors 220A and 220B can resolve positive common mode voltage. For case No. 4, both the input at the positive side and the input at the negative side are less than the comparator common mode. Thus, capacitors 220A and 220B can resolve a negative common mode voltage.

To reduce a difference between the input common mode voltage and Vref/2, for example, the logic circuitry 250 can apply a correction voltage to one or more of the bit-trial capacitors 220A, 220B. In particular, using the techniques of this disclosure, the logic circuitry 250 can couple the reference voltages REF+ and REF− to the bit-trial capacitors 220A, 220B to provide any common mode residue charge.

This can cause the common mode voltage of top plates to converge to a desired value. In this manner, the reservoir capacitor 301 can be used to provide any differential residue charge to the bit-trial capacitors 220A, 220B, as described below with respect to FIGS. 7 and 8, and the reference voltages REF+ and REF− can be used to provide any common mode residue charge to the bit-trial capacitors 220A, 220B, as described below with FIGS. 9 and 10.

The techniques of this disclosure are applicable to circuits without auxiliary ADC circuits, such as shown in FIG. 3. In such configurations, the comparator 215, e.g., as shown in FIG. 4, can determine the states as shown in Table 1. However, for purposes of conciseness, the techniques will be described with respect to the circuit of FIG. 5, which can include auxiliary ADC circuits in combination with a main ADC circuit.

As mentioned above, the circuit block 222 of FIGS. 3 and 5 can be a unit element or "DAC unit" of a capacitor array of a DAC circuit such that a DAC circuit, e.g., DAC circuit 205 and/or DAC circuit 210 of FIG. 2, can include a number of circuit blocks 222. The DAC units can include most significant bit (MSB) DAC units and least significant bit (LSB) DAC units. In some example configurations, all of the DAC units can be similar such that the MSB and LSB units include the set of switches 312A, 312B, 314A, 314B to transfer a common-mode residue charge from a reference voltage to set the pair of input capacitors when setting the pair of input capacitors in a common-mode configuration based on a decision of the comparator.

In other example configurations, only some of the DAC units include the set of switches 312A, 312B, 314A, 314B. For example, the LSB DAC units in some configurations do not include the switches 312A, 312B, 314A, 314B. In configurations in which the LSB DAC units do not include the switches 312A, 312B, 314A, 314B, either some or all of the MSB DAC units the switches 312A, 312B, 314A, 314B.

Figure 6:
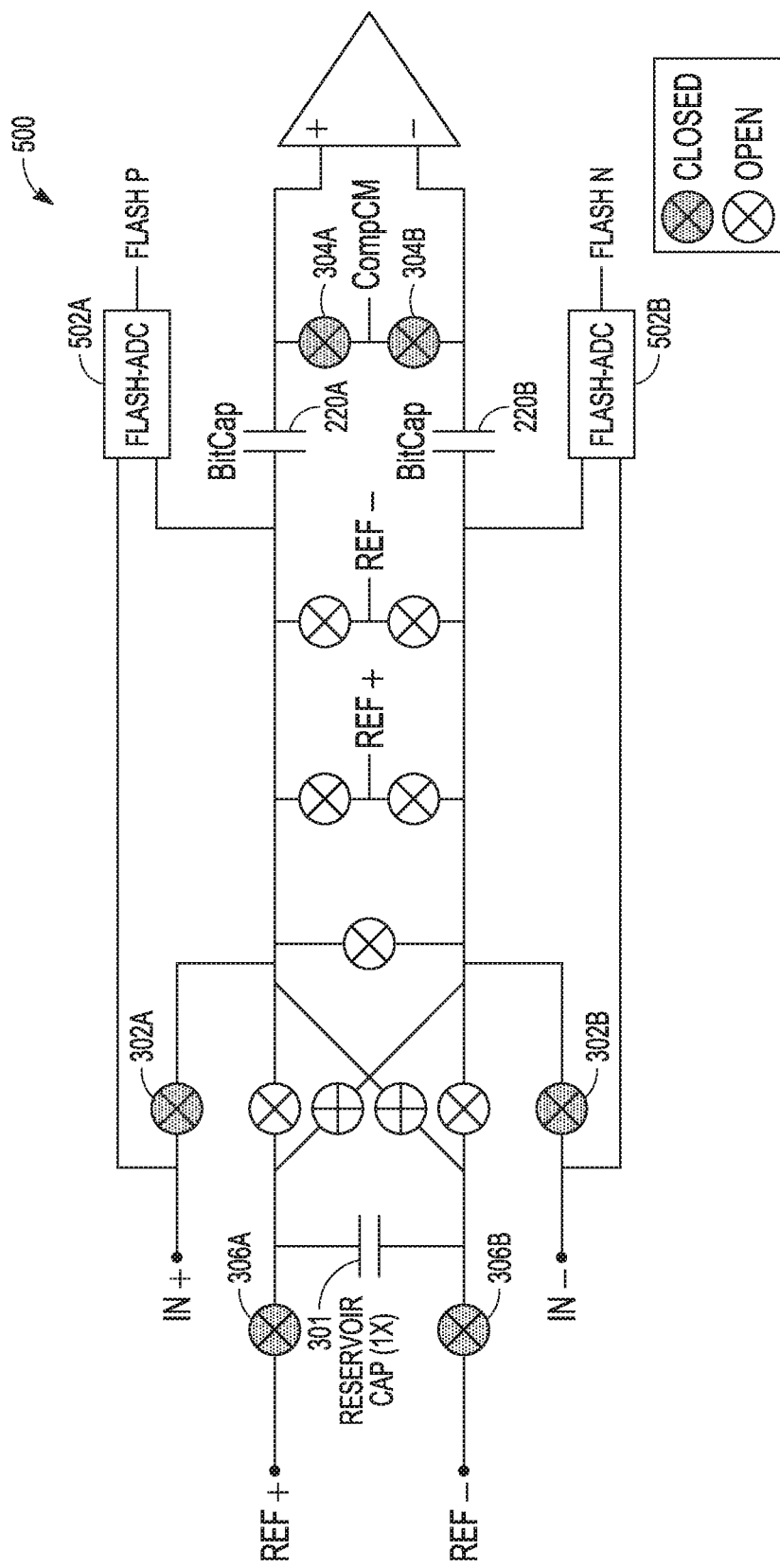
FIG. 6 is a schematic diagram of the circuit block of FIG. 5 in a sampling phase.

FIG. 6 is a schematic diagram of the circuit block 222 of FIG. 5 in a sampling phase. During a sampling phase, the top plate switches 304A, 304B can be closed to couple the top plates of bit-trial capacitors 220A, 220B to the bias voltage, e.g., shown as common mode voltage CompCM. In addition, switches 302A, 302B can be closed to couple the bottom plates of bit-trial capacitors 220A, 220B to analog input signal IN+, IN−, respectively. During the sampling phase, the reservoir capacitor 301 can be charged by coupling to the main reference voltage sources REF+ and REF− using switches 306A, 306B.

The bit-trial capacitors of the DAC circuits can store the input signal as sampled charge and deliver a differential input voltage to the inputs of the comparator 215. The comparator differential input voltage can represent the imperfection between the original input signal and an estimate of the input signal developed by the DAC circuits. The comparator differential input voltage can include an input common mode offset, and the comparator circuit 215 can include a comparator common mode offset.

The logic circuitry 250 of FIG. 2 can be coupled to positive and negative DAC circuits, the switches, and the comparator circuit, such as shown in FIG. 1. As part of a SAR operation, the logic circuitry 250 can initiate successive bit trials using the weighted bit-trial capacitors to convert the input voltage to a digital value by comparing the outputs of the positive DAC circuit and the negative DAC circuit using the comparator circuit and updating the DAC values. As the conversion progresses, the comparator differential input voltage can be reduced towards zero by transferring charge from the reference reservoir capacitor 301 to the bit-trial capacitors 220A, 220B. This can converge the estimate of the input signal on the DAC circuits to the original input signal.

Figure 7:
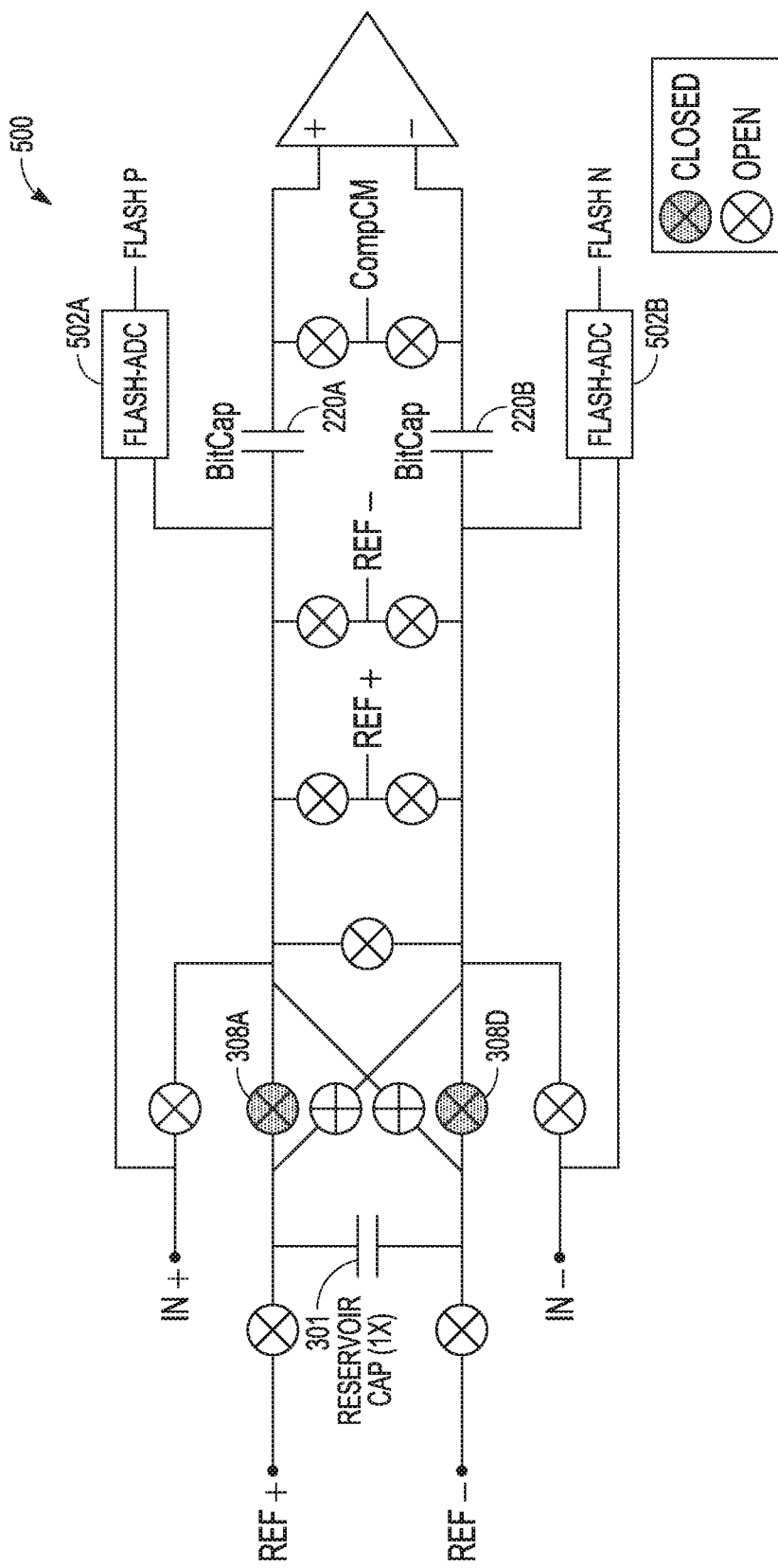
FIG. 7 is a schematic diagram of the circuit block of FIG. 5 in a positive differential residue charge phase.

FIG. 7 is a schematic diagram of the circuit block 222 of FIG. 5 in a positive differential residue charge phase. In the example configuration shown in FIG. 7, the logic circuitry 250 of FIG. 2 determined that to converge the estimate of the input signal on the DAC circuits to the original input signal, a positive differential residue charge can be applied, e.g., based on flash ADC results such as Case No. 1 in Table 1.

To reduce the comparator differential input voltage towards zero, the logic circuit 250 (or "control circuit") can close switches 308A, 308D to transfer charge from the reference reservoir capacitor 301 to set the input capacitors 220A, 220B, e.g., bit-trial capacitors, in a "10" state. In other words, the control circuit can control operation of a first set of switches to transfer a differential residue charge from the reservoir capacitor 301 to the pair of input capacitors 220A, 220B when setting the pair of input capacitors in a differential configuration based on a decision of the comparator. Setting the pair of input capacitors in a differential configuration based on a decision of the comparator can include setting the first plates of the input capacitors to a state "10", which is a first of two states in a first set of states: 01 and 10.

For example, when setting the pair of bit-trial capacitors in a differential configuration based on a bit-trial result to transfer the differential residue charge during the conversion phase, the control circuit 250 can control operation of a first set of switches 308A, 308D to directly couple plates of the reference capacitor 301 to a first plate of the bit-trial capacitor 220A and a first plate of bit-trial capacitor 220B, where a second plate of the bit-trial capacitor 220A and a second plate the bit-trial capacitor 220Bs are configured to couple to inputs of the comparator 215.

Figure 8:
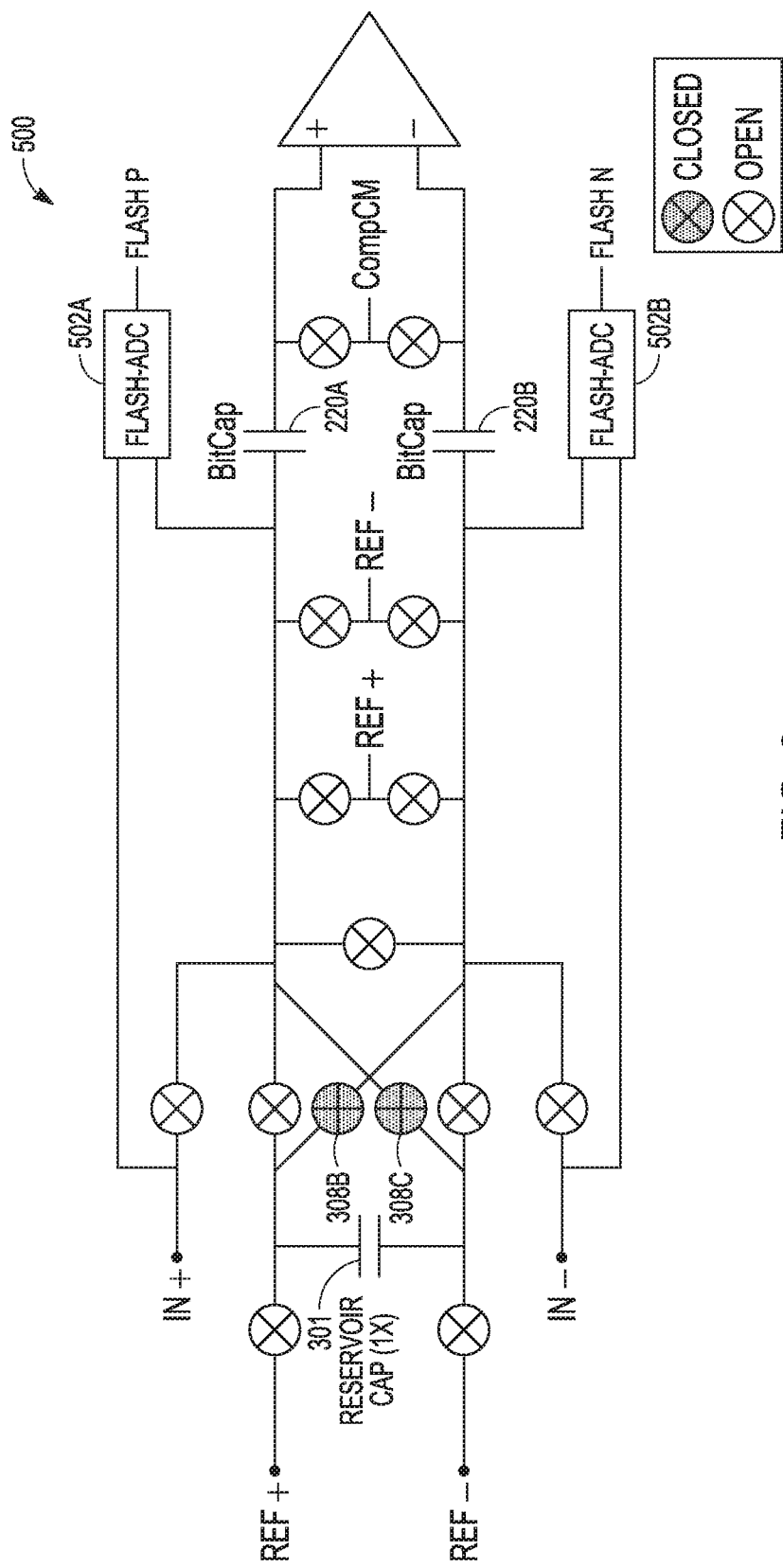
FIG. 8 is a schematic diagram of the circuit block of FIG. 5 in a negative differential residue charge phase.

FIG. 8 is a schematic diagram of the circuit block 222 of FIG. 5 in a negative differential residue charge phase. In the example configuration shown in FIG. 8, the logic circuitry 250 of FIG. 2 determined that to converge the estimate of the input signal on the DAC circuits to the original input signal, a negative differential residue charge can be applied, e.g., based on flash ADC results such as Case No. 2 in Table 1.

To reduce the comparator differential input voltage towards zero, the logic circuit 250 can close switches 308B, 308C to transfer charge by cross-coupling from the reference reservoir capacitor 301 to the input capacitors 220A, 220B, e.g., bit-trial capacitors, to set to a "01" state. In other words, the control circuit can control operation of a first set of switches to transfer a differential residue charge from the reservoir capacitor 301 to the pair of input capacitors 220A, 220B when setting the pair of input capacitors in a differential configuration based on a decision of the comparator. Setting the pair of input capacitors in a differential configuration based on a decision of the comparator can include setting the first plates of the input capacitors to a state "01", which is a second of two states in a first set of states: 01 and 10.

For example, when setting the pair of bit-trial capacitors in a differential configuration based on a bit-trial result to transfer the differential residue charge during the conversion phase, the control circuit 250 can control operation of a first set of switches 308B, 308C to cross-couple plates of the reference capacitor 301 to a first plate of the bit-trial capacitor 220A and a first plate of bit-trial capacitor 220B, where a second plate of the bit-trial capacitor 220A and a second plate the bit-trial capacitor 220Bs are configured to couple to inputs of the comparator 215.

In some example implementations, after coupling the reservoir capacitor 301 to the input capacitors, e.g., bit-trial capacitors, to transfer a first change such as described with respect to FIGS. 7 and 8, the control circuit can couple a reference voltage, e.g., REF+ or REF−, to the previously set input capacitor, e.g., bit-trial capacitor, to transfer a second charge. For example, during a conversion phase, the control circuit, e.g., logic circuit 250 of FIG. 2, can control transfer of a first charge from the reservoir capacitor 301 to set at least one of the bit-trial capacitors 220A, 220B based on a comparator decision. Then, the control circuit can couple a reference voltage, e.g., REF+ or REF−, to the at least one previously set bit-trial capacitors to transfer a second charge, where the reference voltage is more accurate than the voltage of the reservoir, or reference, capacitor.

In this manner, the reservoir capacitor 301 can supply most of the charge to the bit-trial capacitors 220A, 220B as the bit-trials are performed. The accurate reference voltage source, e.g., an "external" reference buffer circuit, only needs to supply the difference, e.g., an inaccuracy, in the charge supplied by the reservoir capacitors. Instead of having to resettle for each bit-trial, the accurate reference voltage source has only to deliver the initial charge to the reservoir capacitors during acquisition and once more when the ADC circuit is ready to sample onto the residue amplifier.

FIG. 9 is a schematic diagram of the circuit block 222 of FIG. 5 in a positive common mode residue charge phase. As explained above, when the outputs of the auxiliary ADC circuits are both 'Is', such as in Case No. 3 in Table 1, both the input at the positive side and the input at the negative side are more than the comparator common mode CompCM because of the positive common mode residue. The logic circuitry 250 can apply a correction voltage to the input capacitors 220A, 220B, e.g., bit-trial capacitors, based upon the bit trial. The logic circuitry 250 (or "control circuit") can close switches 312A, 312B to couple the bit-trial capacitors 220A, 220B to the positive reference voltage REF+ to transfer positive charge to the bit-trial capacitors 220A, 220B.

In other words, the control circuit can control operation of a second set of switches to transfer a common-mode residue charge from a positive reference voltage REF+ to set the pair of input capacitors 220A, 220B when setting the pair of input capacitors in a common-mode configuration based on a decision of the comparator. Setting the pair of input capacitors in a common-mode configuration based on a decision of the comparator includes setting the first plates of the input capacitors to a state "11", which a first of two states in a second set of two states: 11 and 00.

For example, when setting the pair of bit-trial capacitors in a common-mode configuration based on a bit-trial result to transfer the common-mode residue charge during a conversion phase, the control circuit 250 can control operation of a second set of switches 312A, 312B to directly couple the positive reference voltage REF+ to a first plate of the bit-trial capacitor 220A and a first plate of bit-trial capacitor 220B, where a second plate of the bit-trial capacitor 220A and a second plate the bit-trial capacitor 220Bs are configured to couple to inputs of the comparator 215. In this manner, the logic circuitry can correct the difference in the common mode voltages such that the common mode of the input signal matches the comparator common mode CompCM.

Figure 10:
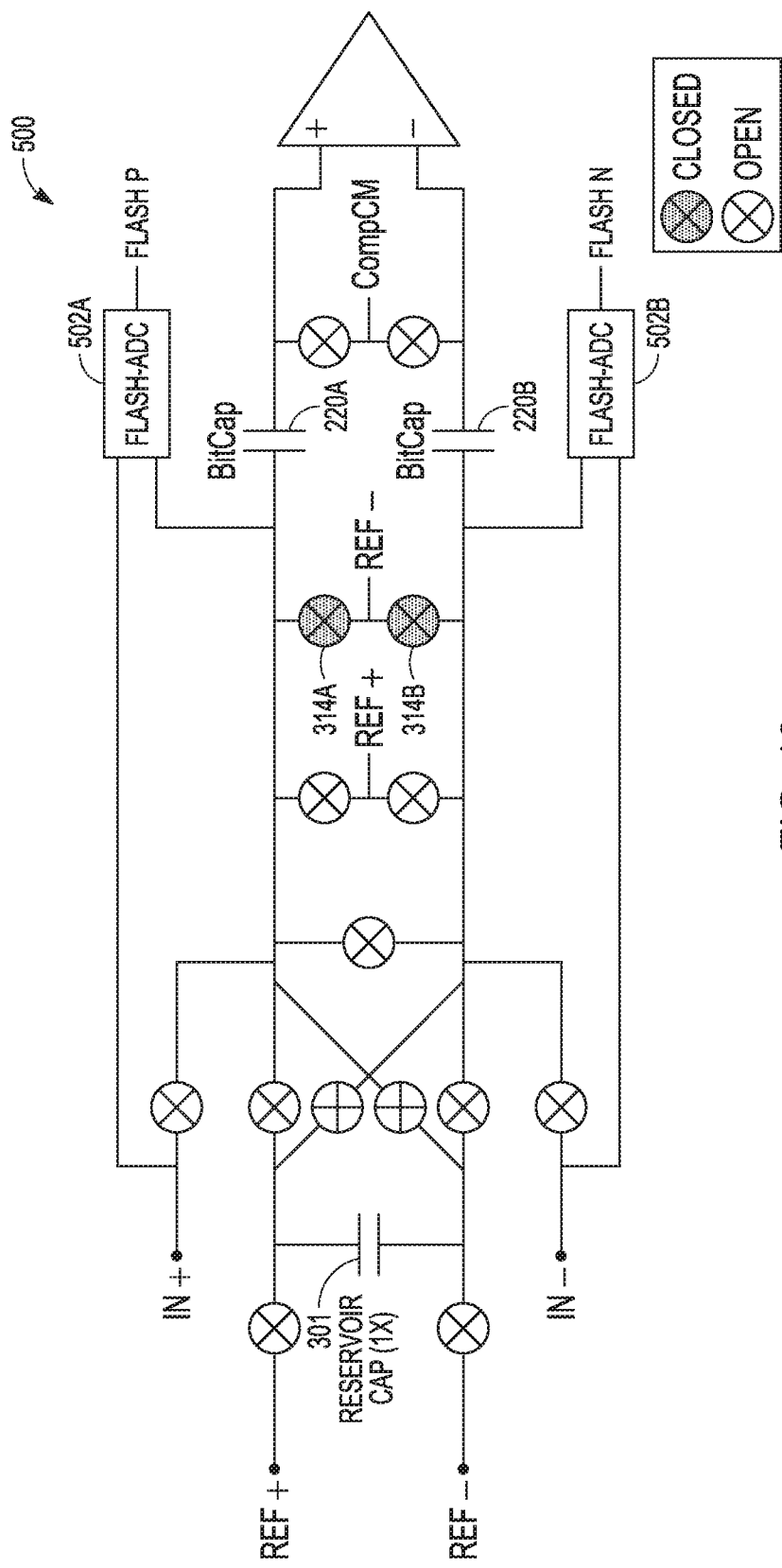
FIG. 10 is a schematic diagram of the circuit block of FIG. 5 in a negative common mode residue charge phase.

FIG. 10 is a schematic diagram of the circuit block 222 of FIG. 6 in a negative common mode residue charge phase. As explained above, when the outputs of the auxiliary ADC circuits are both '0s', such as in Case No. 3 in Table 1, both the input at the positive side and the input at the negative side are less than the comparator common mode CompCM because of the negative common mode residue. The logic circuitry 250 can apply a correction voltage to the input capacitors 220A, 220B, e.g., bit-trial capacitors, based upon the bit trial. The logic circuitry 250 can close switches 314A, 314B to couple the bit-trial capacitors 220A, 220B to the negative reference voltage REF− to transfer negative charge to the bit-trial capacitors 220A, 220B.

In other words, the control circuit can control operation of a second set of switches to transfer a common-mode residue charge from a negative reference voltage REF− to set the pair of input capacitors 220A, 220B when setting the pair of input capacitors in a common-mode configuration based on a decision of the comparator. Setting the pair of input capacitors in a common-mode configuration based on a decision of the comparator includes setting the first plates of the input capacitors to a state "00", which a second of two states in a second set of two states: 11 and 00. In this manner, the logic circuitry can correct the difference in the common mode voltages such that the common mode of the input signal matches the comparator common mode CompCM.

Although the process of correcting for common mode mismatch has been described in terms of one bit of a DAC circuit at a time with respect to FIGS. 9 and 10, the common mode estimation may be performed for several bits of the DAC circuit at the same time. In addition, the correction could be applied to several bits at the same time. Thus, the correction may be applied to a bit capacitor array of the first DAC circuit and a bit capacitor array of the second DAC circuit, where a capacitor array includes one or more bit-trial capacitors.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A differential digital-to-analog (DAC) circuit comprising:
   a capacitor array including a number of DAC units, each DAC unit including:
      a pair of input capacitors configured to couple to a comparator;
      a dedicated reference capacitor associated with the pair of input capacitors; and
   a control circuit configured to:
      control operation of a first set of switches to transfer a differential residue charge from the dedicated reference capacitor to the pair of input capacitors when setting the pair of input capacitors in a differential configuration based on a decision of the comparator; and
      control operation of a second set of switches to transfer a common-mode residue charge from a reference voltage to set the pair of input capacitors when setting the pair of input capacitors in a common-mode configuration based on a decision of the comparator.

2. The differential DAC circuit of claim 1, wherein the input capacitors are bit-trial capacitors, and wherein the control circuit configured to control operation of the first set of switches to transfer the differential residue charge from the the dedicated reference capacitor to the pair of input capacitors when setting the pair of input capacitors in the differential configuration based on the decision of the comparator is configured to:
   control operation of the first set of switches to directly couple or cross-couple plates of the reference capacitor to a first plate of a first one of the pair of bit-trial capacitors and a first plate of a second one of the pair of bit-trial capacitors only when setting the pair of bit-trial capacitors in a differential configuration based on a bit-trial result to transfer the differential residue charge during the conversion phase, and
   wherein a second plate of the first one of the pair of bit-trial capacitors and a second plate of the second one of the pair of bit-trial capacitors are configured to couple to inputs of the comparator.

3. The differential DAC circuit of claim 1, wherein the input capacitors are bit-trial capacitors, and wherein the control circuit configured to control operation of the second set of switches to transfer the common-mode residue charge from the reference voltage to set the pair of input capacitors when setting the pair of input capacitors in the common-mode configuration based on the decision of the comparator is configured to:

control operation of the second set of switches to directly couple the reference voltage to a first plate of a first one of the pair of bit-trial capacitors and the first plate of a second one of the pair of bit-trial capacitors only when setting the pair of bit-trial capacitors in the common-mode configuration based on the bit-trial result to transfer the common-mode residue charge during a conversion phase, wherein a second plate of the first one of the pair of bit-trial capacitors and a second plate of the second one of the pair of bit-trial capacitors are configured to couple to inputs of the comparator.

4. The differential DAC circuit of claim 1, wherein each of the input capacitors includes a first plate and a second plate, wherein setting the pair of input capacitors in the differential configuration based on the decision of the comparator includes setting the first plates of the input capacitors to one of two states in a first set of states: 01 and 10, and wherein setting the pair of input capacitors in the common-mode configuration based on a decision of the comparator includes setting the first plates of the input capacitors to one of two states in a second set of two states: 11 and 00.

5. The differential DAC circuit of claim 1, wherein the control circuit is configured to control a third set of switches to couple the dedicated reference capacitor to the reference voltage during the sampling phase.

6. The differential DAC circuit of claim 1, in combination with a differential analog-to-digital converter (ADC) circuit for converting an analog input to a digital output, the differential ADC circuit comprising a first ADC circuit.

7. The differential DAC circuit of claim 6, wherein the input capacitors are bit-trial capacitors, and wherein the first ADC circuit is a successive approximation register ADC.

8. The differential DAC circuit of claim 6, wherein the input capacitors are bit-trial capacitors, wherein the differential ADC circuit further comprises:

an auxiliary ADC circuit having a resolution less than a resolution of the first ADC circuit, wherein the control circuit is further configured to:
couple the analog input signal onto the auxiliary ADC circuit;
perform at least one bit-trial using the auxiliary ADC circuit; and
load an output of the auxiliary ADC circuit onto at least one of the bit-trial capacitors of the first ADC circuit.

9. The differential DAC circuit of claim 1, wherein the number of DAC units includes most significant bit (MSB) DAC units and least significant bit (LSB) DAC units, wherein the LSB DAC units do not include the second set of switches to transfer the common-mode residue charge from the reference voltage to set the pair of input capacitors when setting the pair of input capacitors in the common-mode configuration based on the decision of the comparator.

10. The differential DAC circuit of claim 1, wherein setting the pair of input capacitors in the differential configuration based on the decision of the comparator includes transferring a first charge, the control circuit is further configured to:

control operation of the second set of switches to couple the reference voltage to the previously set bit-trial capacitor to transfer a second charge.

11. A method of operating a differential analog-to-digital converter (ADC) circuit to convert an analog input to a digital output, the method comprising:

coupling the analog input onto a capacitor array of a first ADC circuit, the capacitor array including a number of DAC units, each DAC unit including:
a pair of input capacitors; and
a dedicated reference capacitor associated with the pair of input capacitors; and transferring a differential residue charge from the dedicated reference capacitor to the pair of input capacitors when setting the pair of input capacitors in a differential configuration based on a decision of a comparator; and transferring a common-mode residue charge from a reference voltage to set the pair of bit-trial capacitors when setting the pair of bit-trial capacitors in a common-mode configuration based on a decision of the comparator.

12. The method of claim 11, wherein the input capacitors are bit-trial capacitors, and wherein transferring the differential residue charge from the the dedicated reference capacitor to the pair of input capacitors when setting the pair of input capacitors in the differential configuration based on the decision of the comparator includes:

controlling operation of a first set of switches to directly couple or cross-couple plates of the reference capacitor to a first plate of a first one of the pair of bit-trial capacitors and a first plate of a second one of the pair of bit-trial capacitors only when setting the pair of bit-trial capacitors in the differential configuration based on the bit-trial result to transfer the differential residue charge during the conversion phase; and coupling a second plate of the first one of the pair of bit-trial capacitors and a second plate of the second one of the pair of bit-trial capacitors to inputs of the comparator.

13. The method of claim 11, wherein the input capacitors are bit-trial capacitors, and wherein transferring the common-mode residue charge from the reference voltage to set the pair of input capacitors when setting the pair of input capacitors in the common-mode configuration based on the decision of the comparator includes:

controlling operation of a second set of switches to directly couple the reference voltage to a first plate of a first one of the pair of bit-trial capacitors and a first plate of a second one of the pair of bit-trial capacitors only when setting the pair of bit-trial capacitors in the common-mode configuration based on the bit-trial result to transfer the common-mode residue charge during a conversion phase; and coupling a second plate of the first one of the pair of bit-trial capacitors and a second plate of the second one of the pair of bit-trial capacitors to inputs of the comparator.

14. The method of claim 11, wherein each of the input capacitors includes a first plate and a second plate, wherein setting the pair of input capacitors in the differential configuration based on the decision of the comparator includes setting the first plates of the input capacitors to one of two states in a first set of states: 01 and 10, and wherein setting the pair of input capacitors in the common-mode configuration based on the decision of the comparator includes setting the first plates of the input capacitors to one of two states in a second set of two states: 11 and 00.

15. The method of claim 11, further comprising:
controlling a third set of switches to couple the reference capacitor to the reference voltage during the sampling phase.

16. The method of claim 11, wherein the input capacitors are bit-trial capacitors, wherein the differential ADC circuit further comprises an auxiliary ADC circuit having a resolution less than a resolution of the first ADC circuit, the method further comprising:
coupling the analog input signal onto the auxiliary ADC circuit;
performing at least one bit-trial using the auxiliary ADC circuit; and
loading an output of the auxiliary ADC circuit onto at least one of the bit-trial capacitors of the first ADC circuit.

17. The method of claim 11, wherein setting the pair of input capacitors in the differential configuration based on the decision of the comparator includes transferring a first charge, the method further comprising:
coupling the reference voltage to the previously set bit-trial capacitor to transfer a second charge.

18. A differential digital-to-analog (DAC) circuit comprising:
means for coupling an analog input onto a capacitor array of a first ADC circuit, the capacitor array including a number of DAC units, each DAC unit including:
a pair of input capacitors; and
a dedicated reference capacitor associated with the pair of input capacitors; and
means for transferring a differential residue charge from the dedicated reference capacitor to the pair of input capacitors when setting the pair of input capacitors in a differential configuration based on a decision of a comparator; and
means for transferring a common-mode residue charge from a reference voltage to set the pair of bit-trial capacitors when setting the pair of bit-trial capacitors in a common-mode configuration based on a decision of the comparator.

19. The differential DAC circuit of claim 18, wherein the input capacitors are bit-trial capacitors, and wherein the means for transferring the differential residue charge from the the dedicated reference capacitor to the pair of input capacitors when setting the pair of input capacitors in the differential configuration based on the decision of the comparator includes:
means for controlling operation of a first set of switches to directly couple or cross-couple plates of the reference capacitor to a first plate of a first one of the pair of bit-trial capacitors and a first plate of a second one of the pair of bit-trial capacitors only when setting the pair of bit-trial capacitors in the differential configuration based on a bit-trial result to transfer the differential residue charge during the conversion phase; and
means for coupling a second plate of the first one of the pair of bit-trial capacitors and a second plate of the second one of the pair of bit-trial capacitors to inputs of the comparator.

20. The differential DAC circuit of claim 18, wherein the input capacitors are bit-trial capacitors, and wherein transferring the common-mode residue charge from a reference voltage to set the pair of input capacitors when setting the pair of input capacitors in the common-mode configuration based on the decision of the comparator includes:
means for controlling operation of a second set of switches to directly couple the reference voltage to a first plate of a first one of the pair of bit-trial capacitors and a first plate of a second one of the pair of bit-trial capacitors only when setting the pair of bit-trial capacitors in the common-mode configuration based on a bit-trial result to transfer the common-mode residue charge during a conversion phase; and
means for coupling a second plate of the first one of the pair of bit-trial capacitors and a second plate of the second one of the pair of bit-trial capacitors to inputs of the comparator.

\* \* \* \* \*

UNITED STATES PATENT AND TRADEMARK OFFICE
CERTIFICATE OF CORRECTION

PATENT NO. : 10,516,411 B1
APPLICATION NO. : 16/032752
DATED : December 24, 2019
INVENTOR(S) : Sandeep Monangi Page 1 of 1

It is certified that error appears in the above-identified patent and that said Letters Patent is hereby corrected as shown below:

On the Title Page

Item (22), in "Filed", in Column 1, Line 1, after "2018", insert --(65) Prior Publication Data US 2020/0021305 A1 Jan. 16, 2020--

On page 2, in Column 2, item (56), under "Other Publications", Line 25, delete "Respnse" and insert --Response-- therefor In the Claims In Column 12, Line 54, in Claim 2, delete "the the" and insert --the-- therefor In Column 13, Line 13, in Claim 3, delete "the" and insert --a-- therefor In Column 14, Line 30, in Claim 12, delete "the the" and insert --the-- therefor In Column 16, Line 9, in Claim 19, delete "the the" and insert --the-- therefor Signed and Sealed this
First Day of September, 2020

Andrei Iancu
*Director of the United States Patent and Trademark Office*